US008445351B2

United States Patent
(12) United States Patent
Wu et al.

(10) Patent No.: US 8,445,351 B2
(45) Date of Patent: May 21, 2013

(54) FLOATING-GATE NONVOLATILE SEMICONDUCTOR MEMORY DEVICE AND METHOD OF MAKING

(75) Inventors: Dongping Wu, Shanghai (CN); Shi-Li Zhang, Stockholm (SE)

(73) Assignee: Fudan University, Shanghai (CN)

( * ) Notice: Subject to any disclaimer, the term of this patent is extended or adjusted under 35 U.S.C. 154(b) by 0 days.

(21) Appl. No.: 13/255,240

(22) PCT Filed: Jan. 4, 2011

(86) PCT No.: PCT/CN2011/000016

§ 371 (c)(1), (2), (4) Date: Sep. 7, 2011

(87) PCT Pub. No.: WO2011/085637

PCT Pub. Date: Jul. 21, 2011

(65) Prior Publication Data

US 2012/0267698 A1 Oct. 25, 2012

(30) Foreign Application Priority Data

Jan. 15, 2010 (CN) .......................... 2010 1 0022877

(51) Int. Cl.

| | |
|---|---|
| ***H01L 21/336*** | (2006.01) |
| ***H01L 21/338*** | (2006.01) |
| ***H01L 21/8238*** | (2006.01) |
| ***H01L 21/425*** | (2006.01) |

(52) U.S. Cl.
USPC ........... 438/301; 438/181; 438/233; 438/514; 257/E21.422

(58) Field of Classification Search
USPC ........... 438/181, 233, 301, 514; 257/E21.422
See application file for complete search history.

(56) References Cited

U.S. PATENT DOCUMENTS

| | | | | |
|---|---|---|---|---|
| 6,534,355 | B2 * | 3/2003 | Ito et al. | 438/201 |
| 6,570,214 | B1 * | 5/2003 | Wu | 257/315 |
| 8,283,244 | B2 * | 10/2012 | Burnett et al. | 438/571 |
| 2002/0163032 | A1 * | 11/2002 | Lin et al. | 257/315 |
| 2002/0190323 | A1 * | 12/2002 | Aoki | 257/351 |
| 2004/0029322 | A1 * | 2/2004 | Prall | 438/142 |
| 2007/0020796 | A1 * | 1/2007 | Park | 438/57 |
| 2008/0153298 | A1 * | 6/2008 | Hui et al. | 438/703 |
| 2008/0157160 | A1 * | 7/2008 | Chan | 257/315 |
| 2010/0078735 | A1 * | 4/2010 | Hoentschel et al. | 257/408 |
| 2012/0267698 | A1 * | 10/2012 | Wu et al. | 257/316 |

* cited by examiner

*Primary Examiner* — Cheung Lee
*Assistant Examiner* — Jeremy Joy
(74) *Attorney, Agent, or Firm* — Jamie J. Zheng, Esq.

(57) ABSTRACT

The present invention provides a floating-gate non-volatile semiconductor memory device and a method of making the same. The floating-gate non-volatile semiconductor memory device comprises a semiconductor substrate, a source, a drain, a first insulator layer, a first polysilicon layer, a second insulator layer, a second polysilicon layer, a protective layer and sidewalls. The source and drain are disposed on the semiconductor substrate. The first insulator layer is disposed over a region of the semiconductor substrate other than regions corresponding to the source and drain. The first polysilicon layer is disposed over the first insulator layer, forming a floating gate. The second insulator layer is disposed over the first polysilicon layer. The second polysilicon layer is disposed over the second insulator layer, forming a control gate and a wordline. The sidewalls are disposed on two sides of the wordline, and the protective layer is disposed over the second polysilicon layer. A semiconductor junction at a drain region is a P-N junction, while a semiconductor junction at a source region is a metal-semiconductor junction.

7 Claims, 6 Drawing Sheets

FLOATING-GATE NONVOLATILE SEMICONDUCTOR MEMORY DEVICE AND METHOD OF MAKING

TECHNICAL FIELD

The present invention is related to memory devices, and more particularly to a kind of floating-gate nonvolatile semiconductor memory devices and method of making the same.

BACKGROUND

Non-volatile memory has wide applications in technology fields such as mobile communications, data terminals, multimedia, consumer electronics, defense electronic equipment, and so on. The rapid increase in data storage capacity places higher demand on high density, high speed, low energy consumption and long endurance memories.

Polysilicon floating-gate non-volatile semiconductor memory constitutes mainstream non-volatile semiconductor memory technology, occupying a major portion of the non-volatile semiconductor memory market, and becoming the fastest developing non-volatile semiconductor memory. Chips having polysilicon non-volatile semiconductor memory devices are shrinking proportionally, following basically Moore's law, i.e., the degree of integration of semiconductor chips increases by doubling every 18 months. Generally speaking, programming and erasure of a polysilicon floating-gate non-volatile semiconductor memory device are done by hot channel electron injection and Fowler-Nordheim tunneling. The programming of the polysilicon floating-gate non-volatile semiconductor memory device is done by hot-channel electron injection near a drain terminal, while the erasure is realized by tunneling through a channel oxidization layer. Generally, the source and drain terminals of polysilicon floating-gate non-volatile semiconductor memory devices are both P-N junctions.

As the device sizes shrink further, however, the channel length of the above mentioned polysilicon floating-gate non-volatile semiconductor memory devices becomes shorter and shorter, and the challenges faced by related technologies become greater and greater. The main challenge relates to the difficulty to reduce programming voltage while still generating sufficient amount of hot electron injections at the drain terminal. The P-N junction structures at both source and drain result in low hot electron injection efficiency, slow programming speed, and high energy consumption. A newly proposed device structure uses Schottky junction structures at both source and drain, but a polysilicon floating-gate non-volatile semiconductor memory device having Schottky junction structures at both source and drain tend to have relatively large leakage current, resulting in low reliability of the polysilicon floating-gate non-volatile semiconductor memory device.

SUMMARY

Because of the above problems associated with conventional polysilicon floating-gate non-volatile semiconductor memory, there is a need to provide low programming voltage, high programming speed, low-energy consumption and high reliability polysilicon floating-gate non-volatile semiconductor memory devices.

A polysilicon floating-gate non-volatile semiconductor memory device comprises a semiconductor substrate, a source, a drain, a first insulator layer, a first polysilicon layer, a second insulator layer, a second polysilicon layer, a protective layer and sidewalls. The source and drain are disposed on the semiconductor substrate. The first insulator layer is disposed over a region of the semiconductor substrate other than regions corresponding to the source and drain. The first polysilicon layer is disposed over the first insulator layer, forming a floating gate. The second insulator layer is disposed over the first polysilicon layer. The second polysilicon layer is disposed over the second insulator layer, forming a control gate and a wordline. The sidewalls are disposed on two sides of the wordline, and the protective layer is disposed over the second polysilicon layer. A semiconductor junction at a drain region is a P-N junction, while a semiconductor junction at a source region is a metal-semiconductor junction.

Preferably, the polysilicon floating-gate non-volatile semiconductor memory device is programmed by using hot electron injections at the source region.

Preferably, a metal used to form the metal-semiconductor junction at the source region is used to form a metal silicide. The metal silicide is any of cobalt silicide, nickel silicide, titanium silicide, tungsten silicide, platinum silicide, and combinations thereof.

Preferably, the polysilicon floating-gate non-volatile semiconductor memory device further includes a hard mask layer formed over the protective layer.

Preferably, the first insulator layer is a silicon dioxide layer.

Preferably, the second insulator layer is structured as an oxide-nitride-oxide "sandwich" structure.

Preferably, the protective layer includes titanium silicide or tungsten silicide.

Preferably, the hard mask layer includes a silicon dioxide layer or silicon nitride layer.

Preferably, the sidewalls include silicon dioxide, silicon nitride or a combination thereof.

A method of making a polysilicon floating-gate non-volatile semiconductor memory device comprises:

providing a semiconductor substrate;

forming consecutively over the semiconductor substrate a first insulator layer, a first polysilicon layer, a second insulator layer, and a second polysilicon layer;

depositing a protective layer directly over the second polysilicon layer; forming a hard mask layer over the protective layer;

etching consecutively the hard mask layer, the protective layer, the second polysilicon layer, the second insulator layer, the first polysilicon layer, the first insulator layer, thereby forming openings corresponding, respectively, to a drain and a source, the openings exposing the semiconductor substrate;

depositing a first dielectric layer, and etching the first dielectric layer while retaining part of the first dielectric layer filling the opening corresponding to the source;

implanting ions at the positions of the openings, thereby forming the P-N junction at the drain; removing the first dielectric layer; forming sidewalls covering sides of the openings corresponding to the drain and source, respectively; and depositing a metal layer, and forming a metal-semiconductor junction at the source.

Preferably, forming the metal-semiconductor junction at the source includes an annealing process, causing the metal layer to react with the semiconductor substrate to form a metal silicide layer.

Preferably, forming the metal-semiconductor junction at the source includes removing part of the metal layer that has not reacted with the semiconductor substrate.

Preferably, the metal silicide includes any of cobalt silicide, nickel silicide, titanium silicide, tungsten silicide, platinum silicide, and combinations thereof.

Preferably, an etching process used to form the openings corresponding to the drain and source, respectively, is an anisotropic dry etching process, a width of the opening corresponding to the drain being wider than a width of the opening corresponding to the source.

Preferably, a deposition thickness of the first dielectric layer is greater than half of the width of the opening corresponding to the source and smaller than half of the width of the opening corresponding to the drain.

Preferably, the protective layer includes titanium silicide or tungsten silicide.

The drain and source of the floating-gate non-volatile semiconductor memory device according to one embodiment of the present disclosure have an asymmetric structure, a semiconductor junction at the drain being a P-N junction, a semiconductor junction at the source being a metal-semiconductor junction, i.e., a Schottky junction. Using hot electron injection at the source to program the device, hot electron injection efficiency is high, energy consumption is low, programming voltage is low, and programming speed is fast. Also, diode leakage of at the drain is small.

DETAILED DESCRIPTION OF THE EMBODIMENTS

Figure 1:
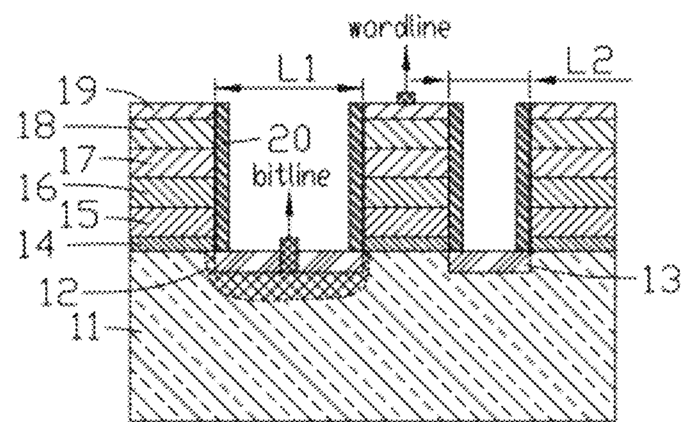
FIG. 1 is a cross-sectional diagram illustrating a polysilicon floating-gate non-volatile semiconductor memory device according to embodiments of the present invention.
Figure 2:
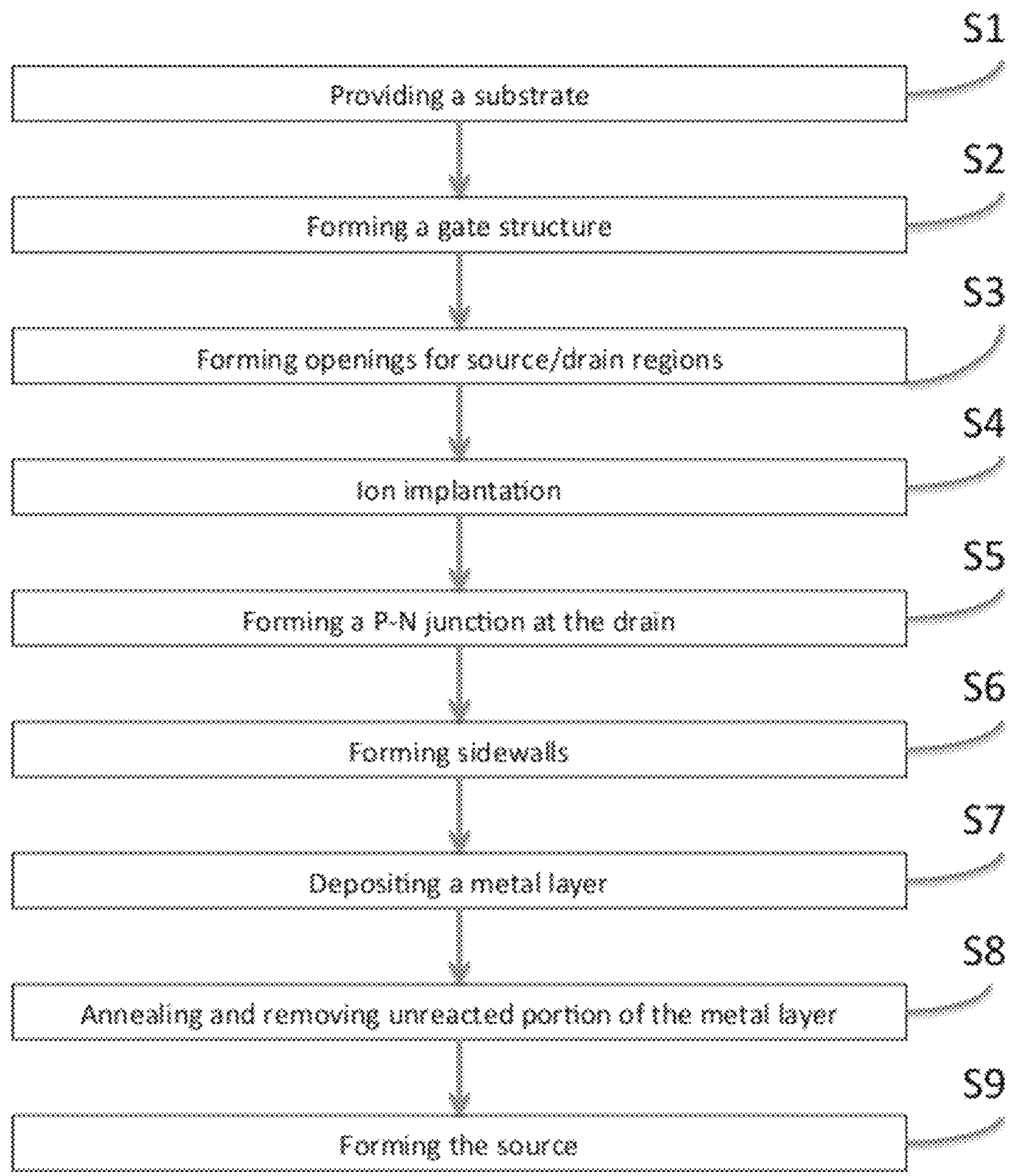
FIG. 2 is a flowchart illustrating a method of making the polysilicon floating-gate non-volatile semiconductor memory device according to a preferred embodiment.

Referring to FIG. 1, which shows a cross-sectional diagram illustrating a polysilicon floating-gate non-volatile semiconductor memory device. The polysilicon floating-gate non-volatile semiconductor memory device comprises a semiconductor substrate 11, a drain 12, a source 13, a first insulator layer 14, a first polysilicon layer 15, a second insulator layer 16, a second polysilicon layer 17, a protective layer 18, a hard mask layer 19, and sidewalls 20.

The drain 12 and source 13 are disposed on the semiconductor substrate 11. The first insulator layer 14 is disposed over a region of the semiconductor substrate 11 other than regions corresponding to the source and drain. The first polysilicon layer 15, the second insulator layer 15, the second polysilicon layer 17, the protective layer 18 and the hard mask layer 19 are consecutively disposed over the first insulator layer 14. Specifically the first insulator layer 14 is disposed between the semiconductor substrate 11 and the first polysilicon layer 15, the second insulator layer 16 is disposed between the first polysilicon 15 and the second polysilicon layer 17, the protective layer 18 is deposited over the second polysilicon layer 17, and the hard mask layer 19 is deposited over a surface of the protective layer 18. The drain 12 includes a contact hole (not shown) that is filled with a metal and is connected to a bitline. The second polysilicon layer 17 and the protective layer 18 together form a wordline. Because a resistivity of the protective layer 18 is lower than that of the second polysilicon layer 17, the wordline is mainly formed by the protective layer 18. The sidewalls 20 are disposed on two sides of the wordline.

Referring to FIGS. 2-14, FIG. 2 is a flowchart illustrating a method of making the polysilicon floating-gate non-volatile semiconductor memory device according to a preferred embodiment, and FIGS. 3-14 are diagrams illustrating main process steps of a method of making the polysilicon floating-gate non-volatile semiconductor memory device. Specific process steps are discussed in the following:

1. Forming Gate Structure

Figure 3:
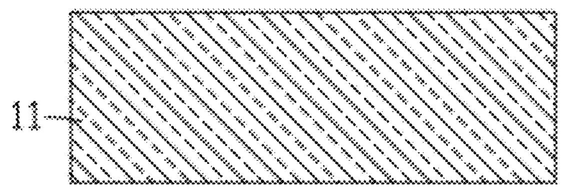
FIGS. 3 to 14 are diagrams illustrating main process steps of a method of making the polysilicon floating-gate non-volatile semiconductor memory device shown in FIG. 1.

In step S1, a semiconductor substrate is provided. As shown in FIG. 3, the semiconductor substrate 11 is provided, which can be a P-type semiconductor substrate.

Figure 4:
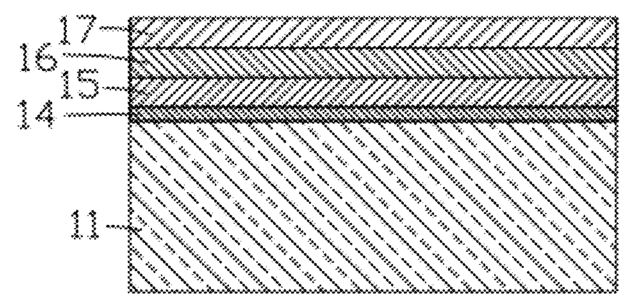

In step S2, a gate structure is formed. As shown in FIG. 4, a first insulator layer 14, a first polysilicon layer 15, a second insulator layer 16, and a second polysilicon layer 17 are consecutively deposited on the semiconductor substrate 11.

The first insulator layer 14 is a tunneling dielectric layer, preferably a oxide layer, such as a silicon dioxide layer. Through Fowler-Nordheim tunneling, electrons can be transported through the first insulator layer from a channel under the first insulator layer 14 to the first polysilicon layer 15 formed over the first insulator layer 14.

The first polysilicon layer 15 is disposed over the first insulator layer 14, thereby forming a charge storage layer, such as a floating gate. Charges transported from a channel under the first insulator layer 14 are stored in the charge storage layer, and the stored charges can also be discharged to the channel through the first insulator layer 14.

Part of the second polysilicon layer 17 is used to form a control gate, which is coupled to a terminal for receiving a high voltage that causes hot electrons to jump over a potential barrier of a channel dielectric layer ($SiO_2$) to reach the floating gate. The second insulator layer 16 is disposed between the first polysilicon layer 15 and the second polysilicon layer 17, thereby insulating the first polysilicon layer 15, which is capable of storing charges, from the second polysilicon layer 17. The second insulator layer 16 can be formed using a stacked oxide layer, nitride layer and oxide layer sandwich structure, i.e., an ONO (oxide/nitride/oxide) structure, which can be, for example, an $SiO_2/Si_3N_4/SiO_2$ structure.

A metal layer is formed over a surface of the second polysilicon layer 17, which is generally a protective layer 18. Because subsequent processes to form the floating-gate semiconductor memory device include one or more high-temperature processes, the protective layer 18 includes tungsten silicide or titanium silicide, in order to withstand the subsequent high-temperature process(s). The protective layer 18 can help reduce an RC delay associated with a subsequently formed wordline.

Figure 5:
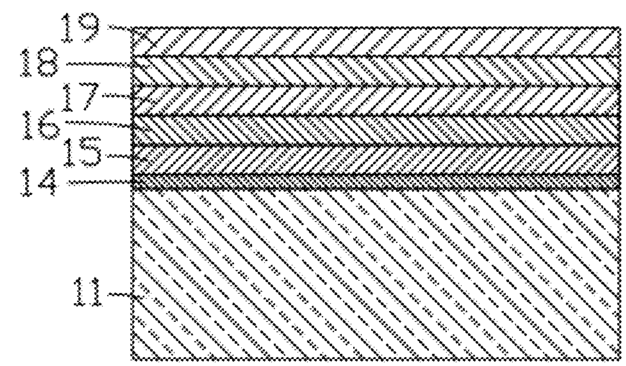

After forming the protective layer 18, a hard mask layer 19 is formed over the protective layer 18, as shown in FIG. 5. The hard mask layer can be a silicon dioxide layer or silicon nitride layer.

2. Forming Source and Drain Regions

Figure 6:
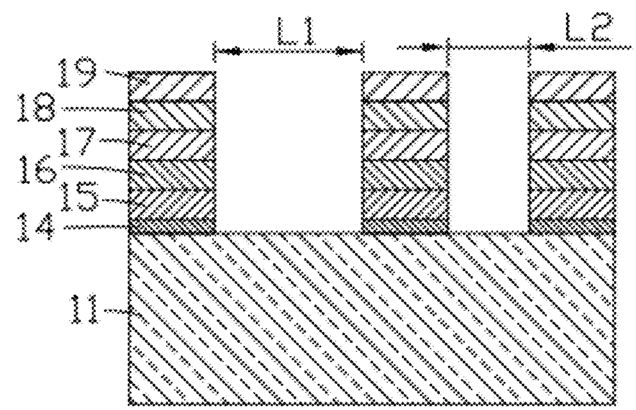

In step S3, a photoresist layer (not shown) is deposited on the hard mask layer 19. The photoresist layer can be a positive or negative photoresist layer. After exposure and developing, etching is performed until the semiconductor substrate is exposed. FIG. 6 illustrates an expected resulting structure including two openings after the photoresist is removed. L1 is a width of the opening corresponding to the drain, and L2 is a width of the opening corresponding to the source, where L1>L2.

3. Forming the Drain

In step S4, ions are implanted to form a highly doped N-type semiconductor region.

Figure 7:
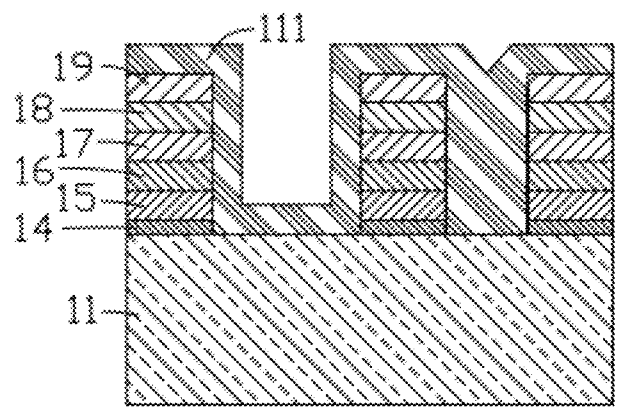

Referring to FIG. 7, after the openings are formed, a first dielectric layer 111 is deposited over the semiconductor substrate and the hard mask layer 19. A thickness of the first dielectric layer 111 is larger than L2/2, which is half the width of the opening corresponding to a source 13 region, and smaller than L1/2. Thus, the opening corresponding to the source 13 region can be completely filled by the first dielectric layer. The first dielectric layer can be a layer of silicon dioxide or silicon nitride or a combination thereof.

Figure 8:
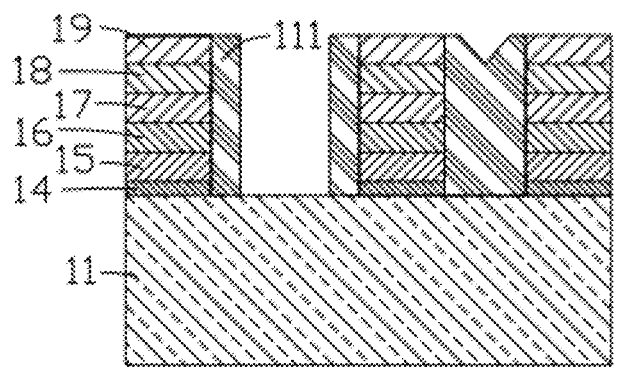

Anisotropic dry etching is used to etch the first dielectric layer 111, etching off part of the first dielectric layer 111 covering the hard mask layer 19 and part of the first dielectric layer 111 covering the drain 12 region, while retaining part of the first dielectric layer covering side walls in the opening corresponding to the drain 12 region and part of the dielectric layer filling the opening corresponding to the source 13 region, as shown in FIG. 8.

Figure 9:
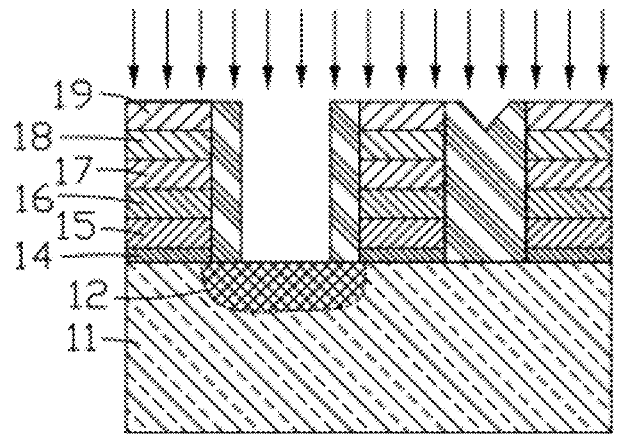

Referring to FIG. 9, an ion implant process is used to implant N-type dopant (such as P or As, etc.) ions into the semiconductor substrate 11, followed by annealing (i.e., step S5) to form a P-N junction at the drain 12 region.

4. Forming the Sidewalls

In step S6, a second dielectric layer 113 is deposited and then etched using anisotropic dry etching to form the sidewalls.

Figure 10:
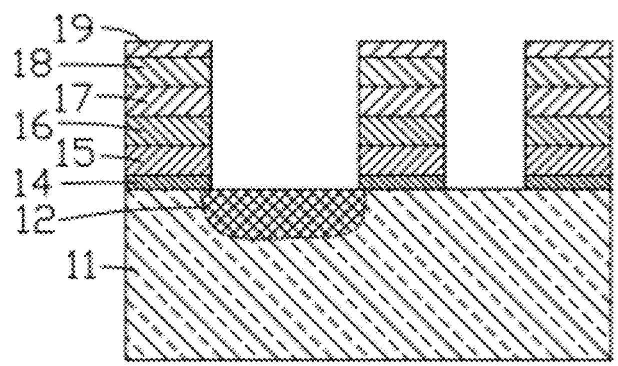

Referring to FIG. 10, first, remaining portions of the first dielectric layer 111 is removed using an anisotropic dry etching process. Referring to FIGS. 9 and 10, the anisotropic dry etching process also etches some of the hard mask layer 19, causing it to become thinner.

Figure 11:
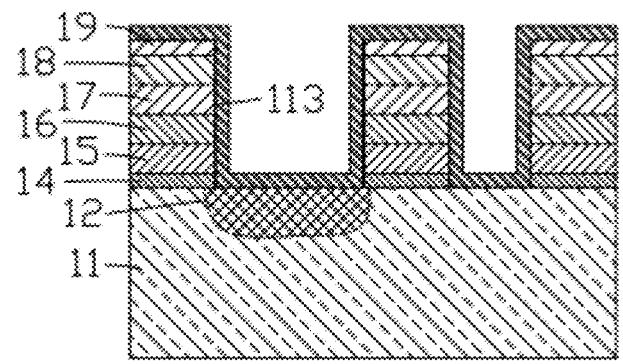

After removing the remaining portions of the first dielectric layer, a second dielectric layer 113 is deposited, which can be a layer of $SiO_2$, $Si_3N_4$ or a combination thereof, as shown in FIG. 11.

Figure 12:
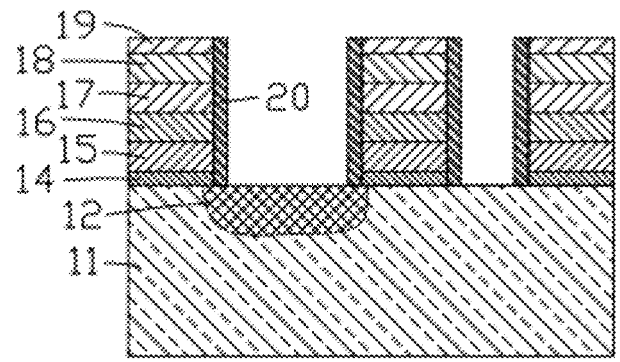

Referring to FIG. 12, an anisotropic dry etching process is used to etch the second dielectric layer 113, while retaining portions of the second dielectric layer 113 covering side walls in the openings corresponding to the drain 12 region and source 13 region, respectively, thereby forming sidewalls 20. The sidewalls 20 are insulating dielectrics, which can be used to insulate between wordlines, and/or between a wordline and a bit line, preventing shorts that cause leakage.

5. Forming the Drain

Figure 13:
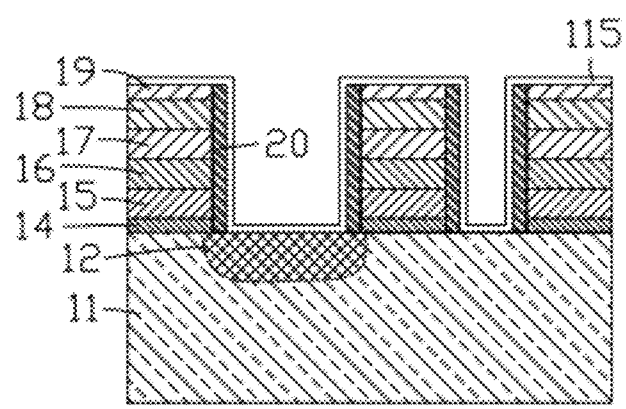

In step S7, a layer of metal 115 is deposited, as shown in FIG. 13. The metal can be titanium, cobalt, nickel, platinum or a combination thereof. During an annealing process, the metal reacts with the semiconductor substrate corresponding to the source region to form silicide, and the metal reacts with the highly doped semiconductor substrate corresponding to the drain region to form silicide, such as titanium silicide, cobalt silicide, nickel silicide, platinum silicide, or a combination thereof.

In step S8, a wet etching process is used to remove unreacted metal. Because of the selectivity of the wet etching process, unreacted metal is etched while some metal silicide is retained instead of being etched.

In step S9, the metal silicide and the P-type semiconductor substrate 11 are in contact with each other at the source region, thereby forming a metal-semiconductor junction (i.e., Schottky junction); while at the drain region, the metal silicide and the highly-doped N-type region form ohmic contact. The semiconductor junction at the drain 12 region is in fact a P-N junction, that is, a P-N junction is formed between the high-dosage ion-implanted N-type region and the P-type semiconductor substrate 11.

Figure 14:
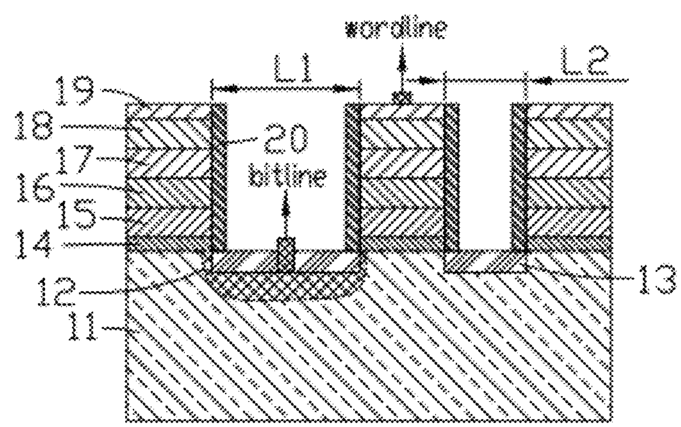

Finally, a contact hole is formed at the drain region, which is filled with a metal and is connected to a subsequently formed bitline (not shown). A wordline is formed using a conductive layer at the gate. A polysilicon floating-gate non-volatile semiconductor memory device is therefore formed, as shown in FIG. 14.

The floating-gate non-volatile semiconductor memory device made using a method according to embodiments of the present invention includes a source 13 with a Schottky junction and a drain 12 with a P-N junction. The floating-gate non-volatile semiconductor memory device is programmed during operation by hot electron injections at the source side. With the Schottky junction structure at the source side, relatively low voltage at the control gate and relatively low drain voltage are needed to generate a desired amount of hot electrons. So, hot electron injection efficiency is high, energy consumption is low, programming voltage is low, and programming speed is fast.

The asymmetric source 13 and drain 12 structure of the floating-gate non-volatile semiconductor memory device can help reduce the diode leakage at the drain, resulting in high device reliability.

The foregoing description and drawings represent the preferred embodiments of the present invention, and are not to be used to limit the present invention. For those skilled in the art, the present invention may be modified and changed. Without departing from the spirit and principle of the present invention, any changes, replacement of similar parts, and improvements, etc., should all be included in the scope of protection of the present invention.

What is claimed is:

1. A method of making a floating-gate non-volatile semiconductor memory device, comprising:

providing a semiconductor substrate;

forming consecutively over the semiconductor substrate a first insulator layer, a first polysilicon layer, a second insulator layer, and a second polysilicon layer;

depositing a protective layer directly over the second polysilicon layer;

forming a hard mask layer over the protective layer;

etching consecutively the hard mask layer, the protective layer, the second polysilicon layer, the second insulator layer, the first polysilicon layer, the first insulator layer, thereby forming openings corresponding, respectively, to a drain and a source, the openings exposing the semiconductor substrate;

depositing a first dielectric layer, and etching the first dielectric layer while retaining part of the first dielectric layer filling the opening corresponding to the source;

implanting ions at the positions of the openings, thereby forming a P-N junction at the drain;

removing the first dielectric layer;

forming sidewalls covering sides of the openings corresponding to the drain and the source, respectively; and depositing a metal layer to form a metal-semiconductor junction at the source.

2. The method of making a floating-gate non-volatile semiconductor memory device according to claim 1, wherein forming the metal-semiconductor junction at the source includes an annealing process, causing the metal layer to react with the semiconductor substrate to form a metal silicide layer.

3. The method of making a floating-gate non-volatile semiconductor memory device according to claim 2, wherein forming the metal-semiconductor junction at the source includes removing part of the metal layer that has not reacted with the semiconductor substrate.

4. The method of making a floating-gate non-volatile semiconductor memory device according to claim 2, wherein the metal silicide is any of cobalt silicide, nickel silicide, titanium silicide, tungsten silicide, platinum silicide, and combinations thereof.

5. The method of making a floating-gate non-volatile semiconductor memory device according to claim 1, wherein an etching process used to form the openings corresponding to the drain and source, respectively, is an anisotropic dry etching process, a width of the opening corresponding to the drain being wider than a width of the opening corresponding to the source.

6. The method of making a floating-gate non-volatile semiconductor memory device according to claim 1, wherein a deposition thickness of the first dielectric layer is greater than half of the width of the opening corresponding to the source and smaller than half of the width of the opening corresponding to the drain.

7. The method of making a floating-gate non-volatile semiconductor memory device according to claim 1, wherein the protective layer includes titanium silicide or tungsten silicide.

* * * * *